(12) United States Patent
Choi

(10) Patent No.: US 9,087,751 B2
(45) Date of Patent: Jul. 21, 2015

(54) ARRAY SUBSTRATE FOR DISPLAY DEVICE AND METHOD OF FABRICATING THE SAME

(71) Applicant: LG DISPLAY CO., LTD., Seoul (KR)

(72) Inventor: Hee-Dong Choi, Chungcheongnam-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/166,617

(22) Filed: Jan. 28, 2014

(65) Prior Publication Data

US 2014/0138694 A1    May 22, 2014

Related U.S. Application Data

(62) Division of application No. 12/840,941, filed on Jul. 21, 2010, now Pat. No. 8,680,530.

(30) Foreign Application Priority Data

Oct. 1, 2009   (KR) .................. 10-2009-0094007

(51) Int. Cl.
*H01L 29/12* (2006.01)
*H01L 27/12* (2006.01)
(Continued)

(52) U.S. Cl.
CPC .......... *H01L 27/1255* (2013.01); *H01L 27/124* (2013.01); *H01L 27/1274* (2013.01); *H01L 29/4908* (2013.01); *H01L 27/12* (2013.01); *H01L 29/78648* (2013.01)

(58) Field of Classification Search
CPC ............ H01L 27/1255; H01L 27/1274; H01L 29/4908; H01L 27/12; H01L 27/1214; H01L 27/124; H01L 29/78648; H01L 27/322; H01L 27/3244; H01L 51/56; F16D 3/64

USPC ................... 257/71–72, 40, 59, 211; 439/149
See application file for complete search history.

(56) References Cited

U.S. PATENT DOCUMENTS 5,811,836 A * 9/1998 Ha ................................. 257/59
7,116,383 B2 * 10/2006 Kim et al. ...................... 349/44

(Continued)

*Primary Examiner* — Mohammed Shamsuzzaman
(74) *Attorney, Agent, or Firm* — McKenna Long & Aldridge LLP

(57) ABSTRACT

An array substrate for a display device includes: a substrate; first and second gate electrodes of impurity-doped polycrystalline silicon on the substrate; a gate insulating layer on the first and second gate electrodes; first and second active layers of intrinsic polycrystalline silicon on the gate insulating layer, the first and second active layers corresponding to the first and second active layers, respectively; an interlayer insulating layer on the first and second active layers and including first to fourth active contact holes, the first and second active contact holes exposing side portions of the first active layer, the third and fourth active contact holes exposing side portions of the second active layer; first and second ohmic contact layers of impurity-doped amorphous silicon on the interlayer insulating layer, the first ohmic contact layer contacting the first active layer through the first and second active contact holes, the second ohmic contact layer contacting the second active layer through the third and fourth active contact hole; first source and drain electrodes on the first ohmic contact layer and second source and drain electrodes on the second ohmic contact layer; a data line on the interlayer insulating layer, the data line connected to the first source electrode; a first passivation layer on the first source and drain electrodes, the second source and drain electrodes and the data line; a gate line on the first passivation layer, the gate line connected to the first gate electrode and crossing the data line to define a pixel region; a second passivation layer on the gate line; and a pixel electrode on the second passivation layer, the pixel electrode connected to the second drain electrode.

2 Claims, 10 Drawing Sheets

(51) Int. Cl.
*H01L 29/49* (2006.01)
*H01L 29/786* (2006.01)

(56) References Cited

U.S. PATENT DOCUMENTS

| | | | |
|---|---|---|---|
| 7,247,878 B2* | 7/2007 | Park et al. | 257/40 |
| 7,989,850 B2* | 8/2011 | Choi | 257/211 |
| 8,222,638 B2* | 7/2012 | Choi | 257/40 |
| 2008/0118743 A1* | 5/2008 | Lee et al. | 428/332 |
| 2008/0303024 A1* | 12/2008 | Song et al. | 257/59 |
| 2009/0146930 A1* | 6/2009 | Nishimura et al. | 345/80 |
| 2009/0256147 A1* | 10/2009 | Kim et al. | 257/43 |
| 2011/0017999 A1* | 1/2011 | Choi | 257/72 |
| 2011/0079783 A1* | 4/2011 | Choi | 257/59 |
| 2011/0079787 A1* | 4/2011 | Choi | 257/71 |
| 2011/0108846 A1* | 5/2011 | Choi et al. | 257/72 |
| 2012/0086009 A1* | 4/2012 | Shin et al. | 257/59 |

* cited by examiner

ARRAY SUBSTRATE FOR DISPLAY DEVICE AND METHOD OF FABRICATING THE SAME

This application is a divisional of prior application Ser. No. 12/840,941, filed Jul. 21, 2010, now allowed, and claims the benefit of Korean Patent Application No. 10-2009-0094007, filed in Korea on Oct. 1, 2009, which are hereby incorporated by reference for all purposes as if fully set forth herein.

BACKGROUND OF THE INVENTION

1. Field of the Invention

The present invention relates to an array substrate for a display device, and more particularly, to an array substrate including a thin film transistor and a storage capacitor and a method of fabricating the array substrate.

2. Discussion of the Related Art

As information technology progresses, flat panel display (FPD) devices having light weight, thin profile and low power consumption have been developed. Specifically, a cathode ray tube (CRT) has been replaced by the FPD devices such as a liquid crystal display (LCD) device or an organic electroluminescent display (ELD) device.

The LCD devices use the optical anisotropy and polarization properties of liquid crystal molecules to produce an image. Among various types LCD devices, an active matrix type liquid crystal display (AM-LCD) device where a thin film transistor (TFT) is formed in each pixel region as a switching element turning on/off a voltage has been the subject of recent research due to its high resolution and superior quality for displaying moving images.

The organic ELD devices have a high brightness and a low driving voltage. In addition, since the organic ELD devices are an emissive type, the organic ELD devices have a high contrast ratio and a thin profile. Also, the organic ELD devices can display images without viewing angle limitations. Further, since the organic ELD devices have a short response time of several microseconds (μs), the organic ELD devices have a stable operation property at a low temperature and an advantage in displaying moving images. Moreover, since the organic ELD devices are driven with a relatively low voltage of about 5 V to about 15 V, the organic ELD devices have advantages in design and fabrication of a driving circuit.

Each of an AM-LCD device and an organic ELD device includes an array substrate having a thin film transistor (TFT) in each pixel region as a switching element for controlling a data signal application. Specifically, the array substrate of the organic ELD device further has a driving TFT for driving an organic electroluminescent (EL) diode in each pixel region.

FIG. 1 is a cross-sectional view showing an array substrate for a display device according to the related art. In FIG. 1, a gate electrode 15 and a gate line (not shown) are formed on a substrate 11 having a pixel region P, and a gate insulating layer 18 is formed on the gate electrode 15 and the gate line. A semiconductor layer 28 including an active layer 22 of intrinsic amorphous silicon and an ohmic contact layer 26 of impurity-doped amorphous silicon is formed on the gate insulating layer 18 over the gate electrode 15. In addition, source and drain electrodes 36 and 38 spaced apart from each other are formed on the ohmic contact layer 26, and a data line 33 is formed over the gate insulating layer 18. A semiconductor pattern 29 including first and second patterns 27 and 23 is formed between the data line 33 and the gate insulating layer 18.

The gate electrode 15, the gate insulating layer 18, the semiconductor layer 28, the source electrode 36 and the drain electrode 38 constitute a thin film transistor (TFT) Tr. When the display device is an organic electroluminescent display device, the TFT Tr may function as a driving TFT, and a switching TFT (not shown) connected to the gate line, the data line 33 and the TFT Tr may be formed in the pixel region P. Further, a passivation layer 42 is formed on the source and drain electrodes 36 and 38, and a pixel electrode 50 is formed on the passivation layer 42 in the pixel region P. The passivation layer 42 includes a drain contact hole 45 exposing the drain electrode 38, and the pixel electrode 50 is connected to the drain electrode 38 through the drain contact hole 45.

In the TFT Tr, the active layer 22 of the semiconductor layer 28 includes a first portion exposed between the ohmic contact layer 26 and a second portion under the ohmic contact layer 26. The first portion of the active layer 22 has a first thickness t1 and the second portion of the active layer 22 has a second thickness t2 different from the first thickness t2 (t1≠t2). The difference between the first and second thicknesses t1 and t2 cause deterioration of the TFT Tr.

FIG. 2 is a cross-sectional showing a step of forming a semiconductor layer, a source electrode and a drain electrode of an array substrate for a display device according to the related art. Although not shown in FIG. 2, an active layer, an impurity-doped amorphous silicon pattern and a source-drain pattern are formed on a substrate 11 by patterning an intrinsic amorphous silicon layer, an impurity-doped amorphous silicon layer and a metal layer. Next, source and drain electrodes 36 and 38 are formed by patterning the source-drain pattern, and the impurity-doped amorphous silicon pattern is exposed between the source and drain electrodes 36 and 38.

In FIG. 2, the impurity-doped amorphous silicon pattern exposed between the source and drain electrodes 36 and 38 is removed by a dry etching method to form an ohmic contact layer 26 under the source and drain electrodes 36 and 38. When the dry etching step is performed for a insufficient time, the impurity-doped amorphous silicon pattern exposed between the source and drain electrodes 36 and 38 may remain on the active layer 26 and the remaining impurity-doped amorphous silicon pattern may deteriorate a thin film transistor (TFT) Tr (of FIG. 1). Accordingly, the dry etching step is performed for a sufficient time to remove the impurity-doped amorphous silicon pattern exposed between the source and drain electrodes 36 and 38 completely and the active layer 22 under the impurity-doped amorphous silicon pattern is partially removed. As a result, the active layer 22 includes a first portion that is exposed between the source and drain electrodes 36 and 38 and has a first thickness t1 and a second portion that is under the ohmic contact layer 26 and has a second thickness t2 different from the first thickness (t1≠t2).

However, the thickness difference between the first and second portions of the active layer 22 deteriorates the TFT Tr. In addition, since the intrinsic amorphous silicon layer is formed to have a sufficient thickness over about 1000 Å based on the partial removal of the active layer 22 in the dry etching step, the deposition time for the intrinsic amorphous silicon layer increases and productivity is reduced.

In an array substrate for a display device such as an AM-LCD device and an organic ELD device, a thin film transistor (TFT) is connected to a gate line, a data line and a pixel electrode in each pixel region and applies a data signal to the pixel electrode selectively and periodically. The TFT includes an active layer and the active layer may be formed of amorphous silicon or polycrystalline silicon. Since amorphous silicon has a random atomic arrangement, amorphous silicon has a transition from a stable state to a quasi-stable state when light is irradiated or when an electric field is applied. Accordingly, the TFT including an active layer of amorphous silicon has problems in stability. In addition, since amorphous silicon has relatively low carrier mobility within a range of about 0.1 $cm^2/Vs$ to about 1.0 $cm^2/Vs$ in a channel region, the TFT including an active layer of amorphous silicon has problems in use as an element of a driving circuit.

To solve the above problems of amorphous silicon, the TFT including an active layer of polycrystalline silicon has been suggested. For example, amorphous silicon for a semiconductor layer may be crystallized to become polycrystalline by a crystallization method using a laser apparatus.

FIG. 3 is a cross-sectional view showing an array substrate including a polycrystalline silicon thin film transistor according to the related art. In FIG. 3, a buffer layer 53 is formed on a substrate 51, and a semiconductor layer 55 of polycrystalline silicon is formed on the buffer layer 53. The semiconductor layer 55 includes an active region 55a of intrinsic polycrystalline silicon and a source-drain region 55b of impurity-doped polycrystalline silicon at both sides of the active region 55a. The source-drain region 55b may include one of negative type impurities of high concentration (n+) and positive type impurities of high concentration (p+).

A gate insulating layer 58 is formed on the semiconductor layer 55, and a gate electrode 59 is formed on the gate insulating layer 58 over the semiconductor layer 55. In addition, an interlayer insulating layer 61 is formed on the gate electrode 59, and source and drain electrodes 70 and 72 are formed on the interlayer insulating layer 61. The interlayer insulating layer 61 and the gate insulating layer 58 include first and second semiconductor contact holes 63 and 64 exposing the source-drain region 55b, and the source and drain electrodes 70 and 72 are connected to the source-drain region 55b through the first and second semiconductor contact holes 63 and 64, respectively. A passivation layer 75 is formed on the source and drain electrodes 70 and 72, and a pixel electrode 82 is formed on the passivation layer 75. The passivation layer 75 includes a drain contact hole 78 exposing the drain electrode 72, and the pixel electrode 82 is connected to the drain electrode 78 through the drain contact hole 78.

The source-drain region 55b may be formed by doping the semiconductor layer of intrinsic polycrystalline silicon with the impurities, and the doping step may be performed using an ion implantation apparatus. Accordingly, an additional apparatus is required for fabricating a polycrystalline silicon TFT and fabrication cost increases.

Further, when a bottom gate structure where a gate electrode is under a semiconductor layer is applied to a polycrystalline silicon TFT, a crystallization step having a relatively high process temperature is performed for a semiconductor layer of amorphous silicon over a gate electrode. Since the gate electrode is formed of a metallic material, the gate electrode may be degraded during the crystallization step.

Moreover, as a display device having higher quality and higher resolution is required, a size of a pixel region is reduced. As a result, a sufficient capacitance of a storage capacitor without reduction of aperture ratio has been the subject of recent research and development.

SUMMARY OF THE INVENTION

Accordingly, the present invention is directed to an array substrate for a display device and a method of fabricating the same that substantially obviate one or more of the problems due to limitations and disadvantages of the related art.

An object of the present invention is to provide an array substrate for a display device where a property of a thin film transistor is improved by protecting an active layer during a dry etching step and forming a semiconductor layer of polycrystalline silicon without a doping step and a method of fabricating the array substrate.

Another object of the present invention is to provide an array substrate for a display device where a thin film transistor has a bottom gate structure due to a gate electrode of polycrystalline silicon and a method of fabricating the array substrate.

Another object of the present invention is to provide an array substrate for a display device where a sufficient capacitance of a storage capacitor is obtained without reduction of aperture ratio and a method of fabricating the array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a display device includes: a substrate; first and second gate electrodes of impurity-doped polycrystalline silicon on the substrate; a gate insulating layer on the first and second gate electrodes; first and second active layers of intrinsic polycrystalline silicon on the gate insulating layer, the first and second active layers corresponding to the first and second active layers, respectively; an interlayer insulating layer on the first and second active layers and including first to fourth active contact holes, the first and second active contact holes exposing side portions of the first active layer, the third and fourth active contact holes exposing side portions of the second active layer; first and second ohmic contact layers of impurity-doped amorphous silicon on the interlayer insulating layer, the first ohmic contact layer contacting the first active layer through the first and second active contact holes, the second ohmic contact layer contacting the second active layer through the third and fourth active contact hole; first source and drain electrodes on the first ohmic contact layer and second source and drain electrodes on the second ohmic contact layer; a data line on the interlayer insulating layer, the data line connected to the first source electrode; a first passivation layer on the first source and drain electrodes, the second source and drain electrodes and the data line; a gate line on the first passivation layer, the gate line connected to the first gate electrode and crossing the data line to define a pixel region; a second passivation layer on the gate line; and a pixel electrode on the second passivation layer, the pixel electrode connected to the second drain electrode.

In another aspect, a method of fabricating an array substrate for a display device includes: sequentially forming a first impurity-doped amorphous silicon layer, a first inorganic insulating layer and an intrinsic amorphous silicon layer on a substrate; crystallizing the first impurity-doped amorphous silicon layer and the intrinsic amorphous silicon layer to form an impurity-doped polycrystalline silicon layer and an intrinsic polycrystalline silicon layer; patterning the impurity-doped polycrystalline silicon layer, the first organic insulating layer and the intrinsic polycrystalline silicon layer to form a first gate electrode, a gate insulating layer and a first active layer of polycrystalline silicon sequentially on the substrate and a second gate electrode, the gate insulating layer and a second active layer of polycrystalline silicon sequentially on the substrate; forming an interlayer insulating layer on the first and second active layers, the interlayer insulating layer including first to fourth active contact holes, the first and second active contact holes exposing side portions of the first active layer, the third and fourth active contact holes exposing side portions of the second active layer; sequentially forming a second impurity-doped amorphous silicon layer and a first metal layer on the interlayer insulating layer; patterning the second impurity-doped amorphous silicon layer and the first metal layer to form first and second ohmic contact layers, first source and drain electrodes on the first ohmic contact layer, second source and drain electrodes on the second ohmic contact layer and a data line on the interlayer insulating layer, the first ohmic contact layer contacting the first active layer through the first and second active contact holes, the second ohmic contact layer contacting the second active layer through the third and fourth active contact hole; forming a first passivation layer on the first source and drain electrodes, the second source and drain electrodes and the data line; forming a gate line on the first passivation layer, the gate line connected to the first gate electrode and crossing the data line to define a pixel region; forming a second passivation layer on the gate line; and forming a pixel electrode on the second passivation layer, the pixel electrode connected to the second drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
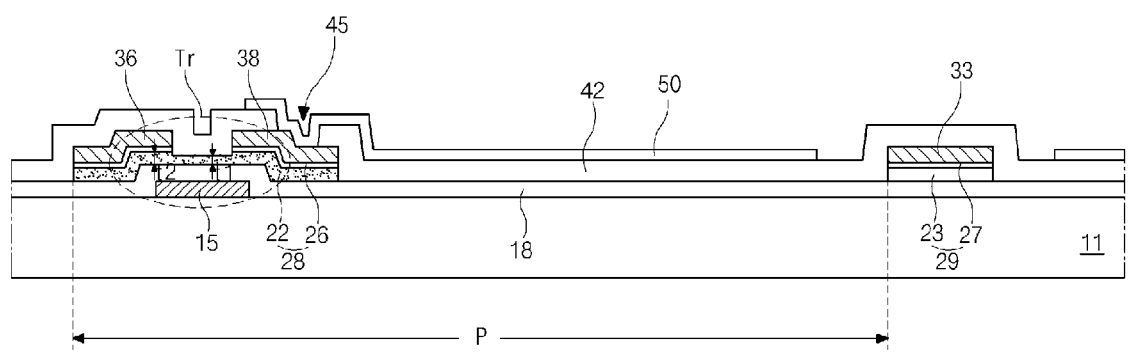
FIG. 1 is a cross-sectional view showing an array substrate for a display device according to the related art.
Figure 2:
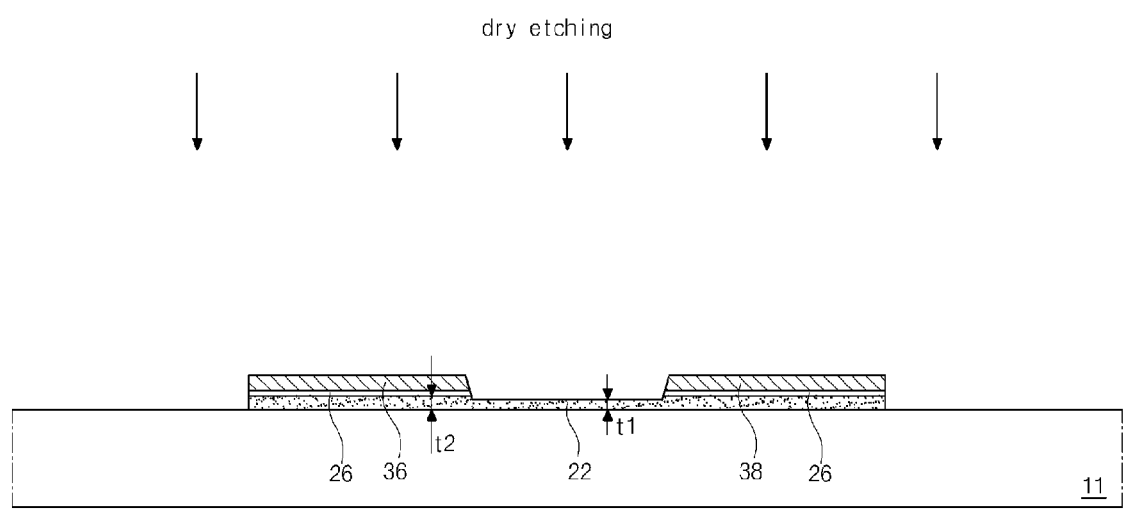
FIG. 2 is a cross-sectional showing a step of forming a semiconductor layer, a source electrode and a drain electrode of an array substrate for a display device according to the related art.
Figure 3:
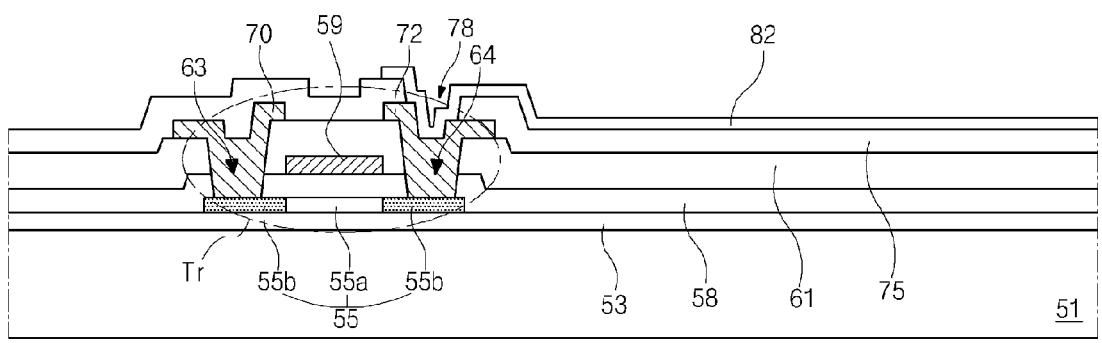
FIG. 3 is a cross-sectional view showing an array substrate including a polycrystalline silicon thin film transistor according to the related art.
Figure 4:
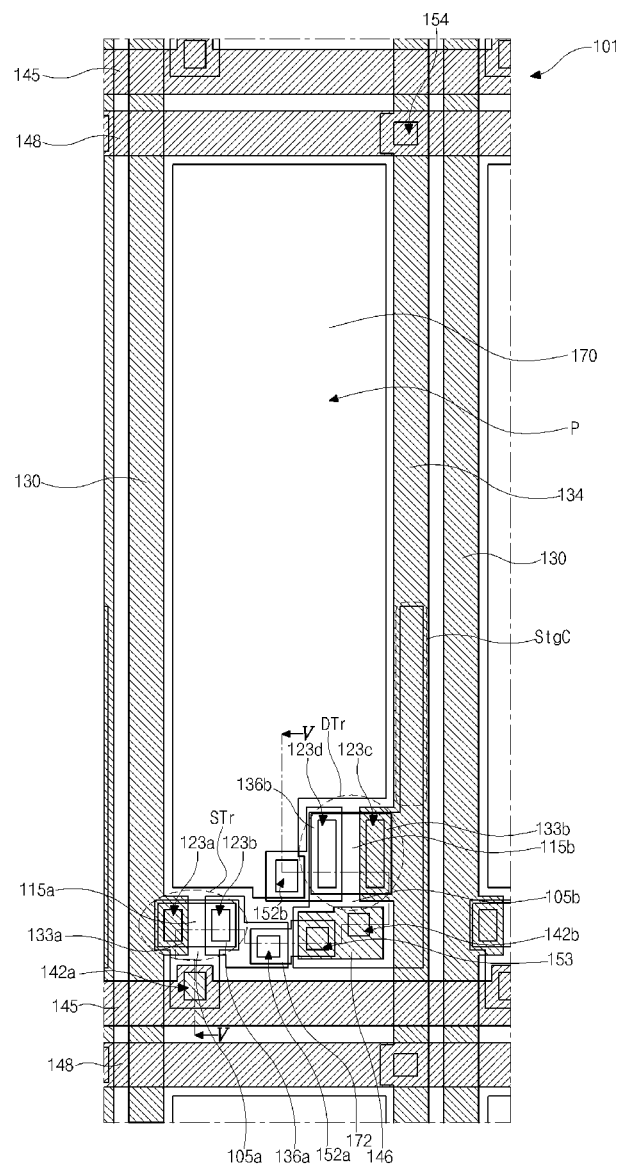
FIG. 4 is a plan view showing an array substrate for an organic electroluminescent display device according to a first embodiment of the present invention.

FIG. 4 is a plan view showing an array substrate for an organic electroluminescent display device according to a first embodiment of the present invention.

In FIG. 4, a gate line 145, a data line 130 and a power line 148 are formed on a substrate 101. The gate line 145 and the data line 130 cross each other to define a pixel region P, and the power line 148 is spaced apart from the gate line 145. A power electrode 134 connected to the power line 148 through a power contact hole 154 is formed to be parallel to the data line 130.

In addition, a switching thin film transistor (TFT) STr and a driving TFT DTr connected to each other are formed in the pixel region P. The switching TFT STr includes a first gate electrode 105a, a first active layer 115a, a first source electrode 133a and a first drain electrode 136a, and the driving TFT DTr includes a second gate electrode 105b, a second active layer 115b, a second source electrode 133b and a second drain electrode 136b. The first gate electrode 105a is connected to the gate line 145 through a first gate contact hole 142a, and the first source electrode 133a is connected to the data line 130. A gate auxiliary pattern 146 is connected to the second gate electrode 105b through a second gate contact hole 142b, and a gate connecting electrode 172 is connected to the first drain electrode 136a through a first drain contact hole 152a and to the gate auxiliary pattern 146 through an auxiliary contact hole 153. The second source electrode 133b extends to the power electrode 134.

Further, a pixel electrode 170 is formed in the pixel region, and an organic luminescent layer (not shown) is formed on the pixel electrode 170. The pixel electrode 170 is connected to the second drain electrode 136b through a second drain contact hole 152b. The organic luminescent layer emits one of red, green and blue colored lights and the organic luminescent layers emitting different colored lights may be alternately disposed in the pixel regions P. A reference electrode (not shown) is formed on the organic luminescent layer. The reference electrode may be formed over an entire surface of the substrate 101.

The power electrode 134 overlaps the second gate electrode 105b with a gate insulating layer (not shown) and an interlayer insulating layer (not shown) interposed therebetween to constitute a storage capacitor StgC. In addition, the pixel electrode 170, the organic luminescent layer and the reference electrode constitute an organic electroluminescent (EL) diode (not shown). For example, the pixel electrode 170 may function as an anode of the organic EL diode and include a transparent conductive material having a relatively high work function. The reference electrode may function as a cathode of the organic EL diode and include a metallic material having a relatively low work function. Although not shown in FIG. 4, a bank of one of inorganic and organic insulating materials is formed at a boundary portion of the pixel region P. The bank overlaps the pixel electrode 170 to separate the organic luminescent layers in adjacent pixel regions P and to prevent an electric shortage between the pixel electrode 170 and the reference electrode.

Figure 5:
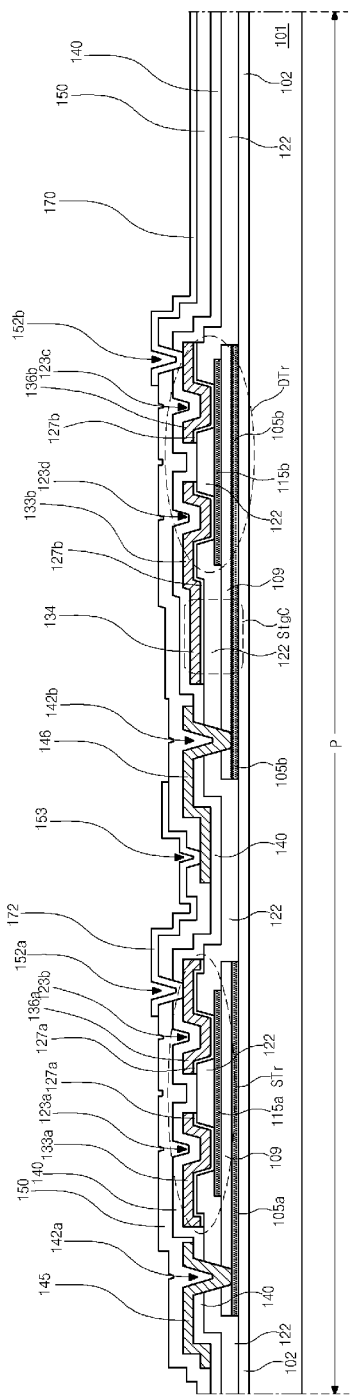
FIG. 5 is a cross-sectional view, which is taken along a line V-V of FIG. 4, showing an array substrate for an organic electroluminescent display device according to a first embodiment of the present invention.

FIG. 5 is a cross-sectional view, which is taken along a line V-V of FIG. 4, showing an array substrate for an organic electroluminescent display device according to a first embodiment of the present invention.

In FIG. 5, a buffer layer 102 of an inorganic insulating material is formed on an entire surface of a substrate 101, and first and second gate electrodes 105a and 105b each including an impurity-doped polycrystalline silicon are formed on the buffer layer 102. A gate insulating layer 109 of an inorganic insulating material is formed on the first and second gate electrodes 105a and 105b, and first and second active layers 115a and 115b each including an intrinsic polycrystalline silicon are formed on the gate insulating layer 109. The first and second active layers 115a and 115b are formed over the first and second gate electrodes 105a and 105b, respectively.

In addition, an interlayer insulating layer 122 including first to fourth active contact holes 123a, 123b, 123c and 123d is formed on the first and second active layers 115a and 115b. The first and second active contact holes 123a and 123b expos side portions of the first active layer 115a, respectively, and the third and fourth active contact holes 123c and 123d expose side portions of the second active layer 115b, respectively. First and second ohmic contact layers 127a and 127b of impurity-doped amorphous silicon are formed on the interlayer insulating layer 122. The first ohmic contact layer 127a is connected to the side portions of the first active layer 115a through the first and second active contact holes 123a and 123b, and the second ohmic contact layer 127b is connected to the side portions of the second active layer 115b through the third and fourth active contact holes 123c and 123d. A first source electrode 133a and a first drain electrode 136a spaced apart from each other are formed on the first ohmic contact layer 127a, and a second source electrode 133b and a second drain electrode 136b spaced apart from each other are formed on the second ohmic contact layer 127b. In addition, a power electrode 134 is formed on the second ohmic contact layer 127b. The second source electrode 133b extends to the power electrode 134 and the power electrode 134 is connected to a power line 148 (of FIG. 4). A data line 130 (of FIG. 4) connected to the first source electrode 133a is formed on the interlayer insulating layer 122.

The power electrode 134 and the second gate electrode 105b overlap each other with the gate insulating layer 109 and the interlayer insulating layer 122 interposed therebetween to constitute a storage capacitor StgC. In addition, the first gate electrode 105a, the gate insulating layer 109, the first active layer 115a, the first ohmic contact layer 127a, the first source electrode 133a and the first drain electrode 136a constitute a switching thin film transistor (TFT) STr, and the second gate electrode 105b, the gate insulating layer 109, the second active layer 115b, the second ohmic contact layer 127b, the second source electrode 133b and the second drain electrode 136b constitute a driving TFT DTr.

Further, a first passivation layer 140 of an inorganic insulating material is formed on the first source electrode 133a, the first drain electrode 136a, the second source electrode 133b, the second drain electrode 136b and the data line. The first passivation layer 140, the interlayer insulating layer 122 and the gate insulating layer 109 include first and second gate contact holes 142a and 142b exposing the first and second gate electrodes 105a and 105b, respectively. Although not shown in FIG. 5, the first passivation layer 140 includes a power contact hole exposing the power electrode 134 extending from the second source electrode 133b.

A gate line 145 and a gate auxiliary pattern 146 are formed on the first passivation layer 140. The gate line 145 crosses the data line to define a pixel region P and is connected to the first gate electrode 105a through the first gate contact hole 142a. The gate auxiliary pattern 146 is connected to the second gate electrode 105b through the second gate contact hole 142b. The power line 148 (of FIG. 4) parallel to the gate line 145 is formed on the first passivation layer 140. The power line 148 is connected to the power electrode 134 through the power contact hole.

Moreover, a second passivation layer 150 of an inorganic insulating material is formed on the gate line 145 and the gate auxiliary pattern 146. The second passivation layer 150 includes an auxiliary contact hole 153 exposing the gate auxiliary pattern 146. In addition, the second passivation layer 150 and the first passivation layer 140 include first and second drain contact holes 152a and 152b exposing the first and second drain electrodes 136a and 136b, respectively.

A pixel electrode 170 and a gate connecting electrode 172 each including a transparent conductive material are formed on the second passivation layer 150. The pixel electrode 170 is connected to the second drain electrode 136b through the second drain contact hole 152b. In addition, the gate connecting electrode 172 is connected to the first drain electrode 136a through the first drain contact hole 152a and to the gate auxiliary pattern 146 through the auxiliary contact hole 153.

Although not shown in FIG. 5, a bank of one of inorganic and organic insulating materials is formed at a boundary portion of the pixel region P. The bank may be formed on the second passivation layer 150 and the gate connecting electrode 172. In addition, an organic luminescent layer is formed on the pixel electrode 170 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 101. The pixel electrode 170, the organic luminescent layer and the reference electrode in the pixel region P constitute an organic electroluminescent (EL) diode.

A method of fabricating an array substrate for an organic electroluminescent display device according to a first embodiment of the present invention will be illustrated hereinafter with reference to FIGS. 4 and 5.

In FIGS. 4 and 5, the buffer layer 102 is formed on the substrate 101 by depositing an inorganic insulating material such as silicon nitride (SiNx) and silicon oxide ($SiO_2$). Impurities such as alkali ions may erupt from the substrate 101 during a subsequent crystallization step for the first and second active layers 615a and 615b, for example, a solid phase crystallization (SPC) step with a process temperature of about 600° C. to about 800° C., and the first and second active layers 115a and 115b of polycrystalline silicon may be deteriorated by the impurities. The buffer layer 102 shields the impurities and prevents the deterioration of the first and second active layers 115a and 115b.

A first impurity-doped amorphous silicon layer (not shown), a first inorganic insulating layer (not shown) and an intrinsic amorphous silicon layer (not shown) are sequentially formed on the buffer layer 102 by sequentially depositing impurity-doped amorphous silicon, an inorganic insulating material such as silicon nitride (SiNx) and silicon oxide ($SiO_2$) and intrinsic amorphous silicon. Since channel regions of the first and second active layers 115a and 115b are protected by the interlayer insulating layer 122 during the dry etching step for the first to fourth active contact holes 123a, 123b, 123c and 123d, the thickness difference of the first and second active layers 115a and 115b is prevented. Accordingly, the intrinsic amorphous silicon layer may be formed to have a thickness of about 300 Å to about 1000 Å.

Next, an impurity-doped polycrystalline silicon layer (not shown) and an intrinsic polycrystalline silicon layer (not shown) are formed by crystallizing the first impurity-doped amorphous silicon layer and the intrinsic amorphous silicon layer through the solid phase crystallization (SPC) method. For example, a thermal crystallization method under a process temperature of about 600° C. to about 800° C. or an alternating magnetic field crystallization method under a process temperature of about 600° C. to 700° C. may be used for the crystallization.

Next, the first gate electrode 105a, the gate insulating layer 109 and a first polycrystalline silicon pattern (not shown) and the second gate electrode 105b, the gate insulating layer 109 and a second polycrystalline silicon pattern (not shown) are formed by patterning the impurity-doped polycrystalline silicon layer, the first inorganic insulating layer and the intrinsic polycrystalline silicon layer. The first gate electrode 105a, the gate insulating layer 109 and the first polycrystalline silicon pattern have the same shape as each other, and the second gate electrode 105b, the gate insulating layer 109 and the second polycrystalline silicon pattern have the same shape as each other.

In a bottom gate type polycrystalline silicon TFT, a gate electrode of a metallic material is deteriorated during the crystallization step for an active layer. For example, the gate electrode of a metallic material may be deformed or the metallic material may be diffused through the gate insulating layer into the active layer, which is referred to as a spiking, during the crystallization step having a process temperature of about 600° C. Since the first and second gate electrodes 105a and 105b are formed of impurity-doped amorphous silicon, deterioration of the first and second gate electrodes 105a and 105b during the crystallization step is prevented.

Next, the first and second active layers 115a and 115b of intrinsic polycrystalline silicon are formed by patterning the first and second intrinsic polycrystalline silicon patterns. In addition, the interlayer insulating layer 122 is formed on the first and second active layers 115a and 115b by depositing an inorganic insulating material such as silicon nitride (SiNx) and silicon oxide ($SiO_2$), and the first, second, third and fourth active contact holes 123a, 123b, 123c and 123d are formed by patterning the interlayer insulating layer 122. The first and second active contact holes 123a and 123b expose the side portions of the first active layer 115a, and the third and fourth active contact holes 123c and 123d expose the side portions of the second active layer 115b. Since the interlayer insulating layer 122 covering the central portion of the first and second active layers 115a and 115b functions as an etch stopper during the step of forming the first, second, third and fourth active contact holes 123a, 123b, 123c and 123d, the thickness difference or the deterioration of the first and second active layers 115a and 115b is prevented.

Next, a second impurity-doped amorphous silicon layer (not shown) is formed on the interlayer insulating layer 122 by depositing impurity-doped amorphous silicon, and a first metal layer (not shown) is formed on the second impurity-doped amorphous silicon layer by depositing a first metallic material such as molybdenum (Mo), chromium (Cr) and molybdenum titanium (MoTi). The data line (not shown), the first ohmic contact layer 127a, the first source electrode 133a, the first drain electrode 136a, the second ohmic contact layer 127b, the second source electrode 133b, the second drain electrode 136b, the power electrode 134 are formed by patterning the first metal layer and the second impurity-doped amorphous silicon layer. Each of the data line and the power electrode 134 includes a dummy pattern of impurity-doped amorphous silicon. The first ohmic contact layer 127a contacts the first active layer 115a through the first and second active contact holes 123a and 123b, and the second ohmic contact layer 127b contacts the second active layer 115b through the third and fourth active contact holes 123c and 123d. The first source and drain electrodes 133a and 136a are formed on the first ohmic contact layer 127a, and the second source and drain electrodes 133b and 136b are formed on the second ohmic contact layer 127b.

In another embodiment, a barrier layer of intrinsic amorphous silicon may be formed under the second impurity-doped amorphous silicon layer. The barrier layer may be disposed between the first active layer 115a and the first ohmic contact layer 127a in the first and second active contact holes 123a and 123b and between the second active layer 115b and the second ohmic contact layer 127b in the third and fourth active contact holes 123c and 123d. Since the adhesion between intrinsic polycrystalline silicon and intrinsic amorphous silicon is better than the adhesion between intrinsic polycrystalline silicon and impurity-doped amorphous silicon, the adhesion and the contact resistance between each of the first and second active layers 115a and 115b and each of the first and second ohmic contact layers 127a and 127b may be improved by the barrier layer. The barrier layer may be patterned together with the first and second ohmic contact layers 127a and 127b to have the same shape as the ohmic contact layers 127a and 127b.

Moreover, before the first and second ohmic contact layers 127a and 127b or the barrier layer is formed on the interlayer insulating layer 122, a cleaning step using a buffered oxide etchant (BOE) may be performed for the substrate 101 having the interlayer insulating layer. During the crystallization step having a process temperature of about 600° C. to about 800° C., a surface of the first and second active layers 115a and 115b is oxidized and a thin thermal oxide film is formed on the first and second active layers 115a and 115b. The contact property between each of the first and second active layers 115a and 115b and each of the first and second ohmic contact layers 127a and 127b or between each of the first and second active layers 115a and 115b and the barrier layer may be degraded by the thin thermal oxide film. Accordingly, the thin thermal oxide film exposed through the first, second, third and fourth active contact holes 123a, 123b, 123c and 123d may be removed through the cleaning step using a BOE.

The first gate electrode 105a, the gate insulating layer 109, the first active layer 115a, the first ohmic contact layer 127a, the first source electrode 133a and the first drain electrode 136a constitute a switching thin film transistor (TFT) STr, and the second gate electrode 105b, the gate insulating layer 109, the second active layer 115b, the second ohmic contact layer 127b, the second source electrode 133b and the second drain electrode 136b constitute a driving TFT DTr. In addition, the second gate electrode 105b, the gate insulating layer 109, the interlayer insulating layer 122 and the power electrode 134 overlapping each other constitute a storage capacitor StgC.

Next, the first passivation layer 140 is formed on the first source electrode 133a, the first drain electrode 136a, the second source electrode 133b, the second drain electrode 136b and the data line by depositing an inorganic insulating material such as silicon nitride (SiNx) and silicon oxide ($SiO_2$), and first and second gate contact holes 142a and 142b are formed by patterning the first passivation layer 140, the interlayer insulating layer 122 and the gate insulating layer 109. The first and second gate contact holes 142a and 142b expose the first and second gate electrodes 105a and 105b, respectively. In addition, the power contact hole 154 exposing the power electrode 134 is formed by patterning the first passivation layer 140.

Next, a second metal layer (not shown) is formed on the first passivation layer by depositing a second metallic material such as aluminum (Al), aluminum alloy (e.g., aluminum neodymium (AlNd)), copper (Cu), copper alloy, molybdenum (Mo) and chromium (Cr), and the gate line 145, the gate auxiliary pattern 146 and the power line 148 are formed by patterning the second metal layer. The power line 148 is connected to the power electrode 134 through the power contact hole 154.

Next, the second passivation layer 150 is formed on the gate line 145, the gate auxiliary pattern 146 and the power line 148 by depositing an inorganic insulating material such as silicon nitride (SiNx) and silicon oxide (SiO$_2$), and the first and second drain contact holes 152a and 152b are formed by patterning the second passivation layer 150 and the first passivation layer 140. The first and second drain contact holes 152a and 152b expose the first and second drain electrodes 136a and 136b, respectively. In addition, the auxiliary contact hole 153 exposing the gate auxiliary pattern 146 is formed by patterning the second passivation layer 150.

Next, the pixel electrode 170 and the gate connecting electrode 172 are formed on the second passivation layer 150 by depositing and patterning a transparent conductive material such as indium-tin-oxide (ITO) and indium-zinc-oxide (IZO). The pixel electrode 170 is connected to the second drain electrode 136b through the second drain contact hole 152b, and the gate connecting electrode 172 is connected to the first drain electrode 136a through the first drain contact hole 152a and to the gate auxiliary pattern 146 through the auxiliary contact hole 153.

Next, the bank (not shown) is formed on an edge portion of the pixel electrode 170 by depositing or coating one of inorganic and organic insulating materials, and the organic luminescent layer (not shown) is formed on the bank and the pixel electrode 170. In addition, the reference electrode (not shown) is formed on the organic luminescent layer.

In the organic ELD device according to the first embodiment of the present invention, since the first and second active layers 115a and 115b include intrinsic polycrystalline silicon, a mobility of the switching TFT STr and the driving TFT DTr is improved. In addition, since the first and second gate electrodes 105a and 105b include impurity-doped polycrystalline silicon, the crystallization step for the first and second active layers 115a and 115b is performed without deformation of the first and second gate electrodes 105a and 105b and a polycrystalline silicon TFT having a bottom gate structure is obtained. Further, the interlayer insulating layer 122 on a central portion of the first and second active layers 115a and 115b functions as an etch stopper for a channel region. Accordingly, the first and second active layers 115a and 115b have a uniform thickness and deterioration of the switching TFT STr and the driving TFT DTr due to the thickness difference is prevented. Moreover, since the first and second ohmic contact layers 127a and 127b are formed of impurity-doped amorphous silicon, a doping step using an ion implantation apparatus is omitted and initial investment for an additional apparatus is reduced.

Further, the power electrode 134 extending from the second source electrode 133b and connected to the power line 148 (of FIG. 4) overlaps the second gate electrode 105b with the gate insulating layer 109 and the interlayer insulating layer 122 interposed therebetween to constitute the storage capacitor StgC. As the resolution of the organic ELD device increases, a size of the storage capacitor StgC decreases and a capacitance of the storage capacitor StgC also decreases. In another embodiment, a structure of the storage capacitor StgC is changed to obtain a sufficient capacitance.

Figure 6:
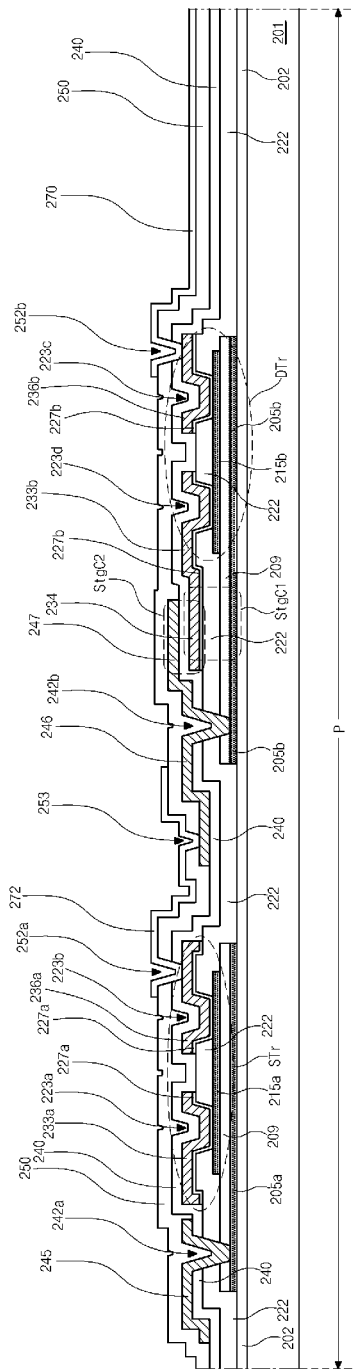
FIG. 6 is a cross-sectional view showing an array substrate for an organic electroluminescent display device according to a second embodiment of the present invention.

FIG. 6 is a cross-sectional view showing an array substrate for an organic electroluminescent display device according to a second embodiment of the present invention.

In FIG. 6, a buffer layer 202 of an inorganic insulating material is formed on an entire surface of a substrate 201, and first and second gate electrodes 205a and 205b each including an impurity-doped polycrystalline silicon are formed on the buffer layer 202. A gate insulating layer 209 of an inorganic insulating material is formed on the first and second gate electrodes 205a and 205b, and first and second active layers 215a and 215b each including an intrinsic polycrystalline silicon are formed on the gate insulating layer 209. The first and second active layers 215a and 215b are formed over the first and second gate electrodes 205a and 205b, respectively.

In addition, an interlayer insulating layer 222 including first to fourth active contact holes 223a, 223b, 223c and 223d is formed on the first and second active layers 215a and 215b. The first and second active contact holes 223a and 223b expos side portions of the first active layer 215a, respectively, and the third and fourth active contact holes 223c and 223d expose side portions of the second active layer 215b, respectively. First and second ohmic contact layers 227a and 227b of impurity-doped amorphous silicon are formed on the interlayer insulating layer 222. The first ohmic contact layer 227a is connected to the side portions of the first active layer 215a through the first and second active contact holes 223a and 223b, and the second ohmic contact layer 227b is connected to the side portions of the second active layer 215b through the third and fourth active contact holes 223c and 223d. A first source electrode 233a and a first drain electrode 236a spaced apart from each other are formed on the first ohmic contact layer 227a, and a second source electrode 233b and a second drain electrode 236b spaced apart from each other are formed on the second ohmic contact layer 227b. In addition, a power electrode 234 is formed on the second ohmic contact layer 227b. The second source electrode 233b extends to the power electrode 234 and the power electrode 234 is connected to a power line (not shown). Although not shown in FIG. 6, a data line connected to the first source electrode 233a is formed on the interlayer insulating layer 222.

The power electrode 234 and the second gate electrode 205b overlap each other with the gate insulating layer 209 and the interlayer insulating layer 222 interposed therebetween to constitute a first storage capacitor StgC1. In addition, the first gate electrode 205a, the gate insulating layer 209, the first active layer 215a, the first ohmic contact layer 227a, the first source electrode 233a and the first drain electrode 236a constitute a switching thin film transistor (TFT) STr, and the second gate electrode 205b, the gate insulating layer 209, the second active layer 215b, the second ohmic contact layer 227b, the second source electrode 233b and the second drain electrode 236b constitute a driving TFT DTr.

Further, a first passivation layer 240 of an inorganic insulating material is formed on the first source electrode 233a, the first drain electrode 236a, the second source electrode 233b, the second drain electrode 236b and the data line. The first passivation layer 240, the interlayer insulating layer 222 and the gate insulating layer 209 include first and second gate contact holes 242a and 242b exposing the first and second gate electrodes 205a and 205b, respectively. Although not shown in FIG. 6, the first passivation layer 240 includes a power contact hole exposing the power electrode 234 extending from the second source electrode 233b.

A gate line 245 and a gate auxiliary pattern 246 are formed on the first passivation layer 240. The gate line 245 crosses the data line to define a pixel region P and is connected to the first gate electrode 205a though the first gate contact hole 242a. The gate auxiliary pattern 246 is connected to the second gate electrode 205b through the second gate contact hole 242b. In addition, the gate auxiliary pattern 246 overlaps the power electrode 234 with the first passivation layer 240 interposed therebetween to constitute a second storage capacitor StgC2. Although not shown in FIG. 6, the power line parallel to the gate line 245 is formed on the first passivation layer 240 and is connected to the power electrode 234 through the power contact hole.

Moreover, a second passivation layer 250 of an inorganic insulating material is formed on the gate line 245 and the gate auxiliary pattern 246. The second passivation layer 250 includes an auxiliary contact hole 253 exposing the gate auxiliary pattern 246. In addition, the second passivation layer 250 and the first passivation layer 240 include first and second drain contact holes 252a and 252b exposing the first and second drain electrodes 236a and 236b, respectively.

A pixel electrode 270 and a gate connecting electrode 272 each including a transparent conductive material are formed on the second passivation layer 250. The pixel electrode 270 is connected to the second drain electrode 236b through the second drain contact hole 252b. In addition, the gate connecting electrode 272 is connected to the first drain electrode 236a through the first drain contact hole 252a and to the gate auxiliary pattern 246 through the auxiliary contact hole 253.

Although not shown in FIG. 6, a bank of one of inorganic and organic insulating materials is formed at a boundary portion of the pixel region P. The bank may be formed on the second passivation layer 250 and the gate connecting electrode 272. In addition, an organic luminescent layer is formed on the pixel electrode 270 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 201. The pixel electrode 270, the organic luminescent layer and the reference electrode in the pixel region P constitute an organic electroluminescent (EL) diode.

In the organic ELD device according to the second embodiment of the present invention, since the first and second active layers 215a and 215b include intrinsic polycrystalline silicon, a mobility of the switching TFT STr and the driving TFT DTr is improved. In addition, since the first and second gate electrodes 205a and 205b include impurity-doped polycrystalline silicon, the crystallization step for the first and second active layers 215a and 215b is performed without deformation of the first and second gate electrodes 205a and 205b and a polycrystalline silicon TFT having a bottom gate structure is obtained. Further, the interlayer insulating layer 222 on a central portion of the first and second active layers 215a and 215b functions as an etch stopper for a channel region. Accordingly, the first and second active layers 215a and 215b have a uniform thickness and deterioration of the switching TFT STr and the driving TFT DTr due to the thickness difference is prevented. Moreover, since the first and second ohmic contact layers 227a and 227b are formed of impurity-doped amorphous silicon, a doping step using an ion implantation apparatus is omitted and initial investment for an additional apparatus is reduced.

Further, the power electrode 234 extending form the second source electrode 233b overlaps the second gate electrode 205b with the gate insulating layer 209 and the interlayer insulating layer 222 interposed therebetween to constitute the first storage capacitor StgC1, and the gate auxiliary pattern 246 connected to the second gate electrode 205b overlaps the power electrode 234 extending from the second source electrode 233b with the first passivation layer 240 interposed therebetween to constitute the second storage capacitor StgC2. Since the first and second storage capacitors StgC1 and StgC2 are connected to the second source electrode 233b of the driving TFT DTr in parallel, the total storage capacitance of the organic ELD device increases.

Figure 7:
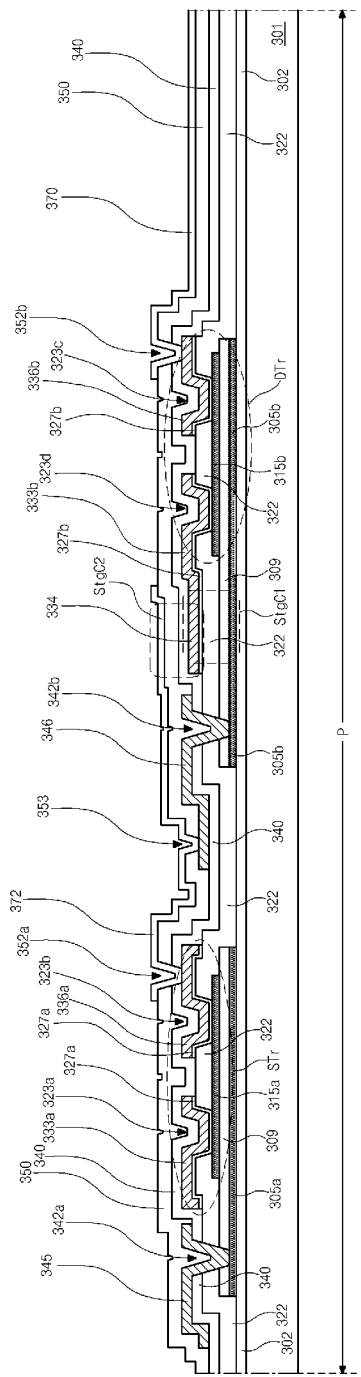
FIG. 7 is a cross-sectional view showing an array substrate for an organic electroluminescent display device according to a third embodiment of the present invention.

FIG. 7 is a cross-sectional view showing an array substrate for an organic electroluminescent display device according to a third embodiment of the present invention.

In FIG. 7, a buffer layer 302 of an inorganic insulating material is formed on an entire surface of a substrate 301, and first and second gate electrodes 305a and 305b each including an impurity-doped polycrystalline silicon are formed on the buffer layer 302. A gate insulating layer 309 of an inorganic insulating material is formed on the first and second gate electrodes 305a and 305b, and first and second active layers 215a and 315b each including an intrinsic polycrystalline silicon are formed on the gate insulating layer 309. The first and second active layers 315a and 315b are formed over the first and second gate electrodes 305a and 305b, respectively.

In addition, an interlayer insulating layer 322 including first to fourth active contact holes 323a, 323b, 323c and 323d is formed on the first and second active layers 315a and 315b. The first and second active contact holes 323a and 323b expose side portions of the first active layer 315a, respectively, and the third and fourth active contact holes 323c and 323d expose side portions of the second active layer 315b, respectively. First and second ohmic contact layers 327a and 327b of impurity-doped amorphous silicon are formed on the interlayer insulating layer 322. The first ohmic contact layer 327a is connected to the side portions of the first active layer 315a through the first and second active contact holes 323a and 323b, and the second ohmic contact layer 327b is connected to the side portions of the second active layer 315b through the third and fourth active contact holes 323c and 323d. A first source electrode 333a and a first drain electrode 336a spaced apart from each other are formed on the first ohmic contact layer 327a, and a second source electrode 333b and a second drain electrode 336b spaced apart from each other are formed on the second ohmic contact layer 327b. In addition, a power electrode 334 is formed on the second ohmic contact layer 327b. The second source electrode 333b extends to the power electrode 334 and the power electrode 334 is connected to a power line (not shown). Although not shown in FIG. 7, a data line connected to the first source electrode 333a is formed on the interlayer insulating layer 322.

The power electrode 334 and the second gate electrode 305b overlap each other with the gate insulating layer 309 and the interlayer insulating layer 322 interposed therebetween to constitute a first storage capacitor StgC1. In addition, the first gate electrode 305a, the gate insulating layer 309, the first active layer 315a, the first ohmic contact layer 327a, the first source electrode 333a and the first drain electrode 336a constitute a switching thin film transistor (TFT) STr, and the second gate electrode 305b, the gate insulating layer 309, the second active layer 315b, the second ohmic contact layer 327b, the second source electrode 333b and the second drain electrode 336b constitute a driving TFT DTr.

Further, a first passivation layer 340 of an inorganic insulating material is formed on the first source electrode 333a, the first drain electrode 336a, the second source electrode 333b, the second drain electrode 336b and the data line. The first passivation layer 340, the interlayer insulating layer 322 and the gate insulating layer 309 include first and second gate contact holes 342a and 342b exposing the first and second gate electrodes 305a and 305b, respectively. Although not shown in FIG. 7, the first passivation layer 340 includes a power contact hole exposing the power electrode 334 extending from the second source electrode 333b.

A gate line 345 and a gate auxiliary pattern 346 are formed on the first passivation layer 340. The gate line 345 crosses the data line to define a pixel region P and is connected to the first gate electrode 305a through the first gate contact hole 342a. The gate auxiliary pattern 346 is connected to the second gate electrode 305b through the second gate contact hole 342b. Although not shown in FIG. 7, the power line parallel to the gate line 345 is formed on the first passivation layer 340 and is connected to the power electrode 334 through the power contact hole.

Moreover, a second passivation layer 350 of an inorganic insulating material is formed on the gate line 345 and the gate auxiliary pattern 346. The second passivation layer 350 includes an auxiliary contact hole 353 exposing the gate auxiliary pattern 346. In addition, the second passivation layer 350 and the first passivation layer 340 include first and second drain contact holes 352a and 352b exposing the first and second drain electrodes 336a and 336b, respectively.

A pixel electrode 370 and a gate connecting electrode 372 each including a transparent conductive material are formed on the second passivation layer 350. The pixel electrode 370 is connected to the second drain electrode 336b through the second drain contact hole 352b. The gate connecting electrode 372 is connected to the first drain electrode 336a through the first drain contact hole 352a and to the gate auxiliary pattern 346 through the auxiliary contact hole 353. In addition, the gate connecting electrode 372 overlaps the power electrode 334 with the second passivation layer 350 and the first passivation layer 340 interposed therebetween to constitute a second storage capacitor StgC2.

Although not shown in FIG. 7, a bank of one of inorganic and organic insulating materials is formed at a boundary portion of the pixel region P. The bank may be formed on the second passivation layer 350 and the gate connecting electrode 372. In addition, an organic luminescent layer is formed on the pixel electrode 370 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 301. The pixel electrode 370, the organic luminescent layer and the reference electrode in the pixel region P constitute an organic electroluminescent (EL) diode.

In the organic ELD device according to the third embodiment of the present invention, since the first and second active layers 315a and 315b include intrinsic polycrystalline silicon, a mobility of the switching TFT STr and the driving TFT DTr is improved. In addition, since the first and second gate electrodes 305a and 305b include impurity-doped polycrystalline silicon, the crystallization step for the first and second active layers 315a and 315b is performed without deformation of the first and second gate electrodes 305a and 305b and a polycrystalline silicon TFT having a bottom gate structure is obtained. Further, the interlayer insulating layer 322 on a central portion of the first and second active layers 315a and 315b functions as an etch stopper for a channel region. Accordingly, the first and second active layers 315a and 315b have a uniform thickness and deterioration of the switching TFT STr and the driving TFT DTr due to the thickness difference is prevented. Moreover, since the first and second ohmic contact layers 327a and 327b are formed of impurity-doped amorphous silicon, a doping step using an ion implantation apparatus is omitted and initial investment for an additional apparatus is reduced.

Further, the power electrode 334 extending form the second source electrode 333b overlaps the second gate electrode 305b with the gate insulating layer 309 and the interlayer insulating layer 322 interposed therebetween to constitute the first storage capacitor StgC1, and the gate connecting electrode 372 connected to the second gate electrode 305b through the gate auxiliary pattern 346 overlaps the power electrode 334 extending from the second source electrode 333b with the second passivation layer 350 and the first passivation layer 340 interposed therebetween to constitute the second storage capacitor StgC2. Since the first and second storage capacitors StgC1 and StgC2 are connected to the second source electrode 333b of the driving TFT DTr in parallel, the total storage capacitance of the organic ELD device increases.

Figure 8:
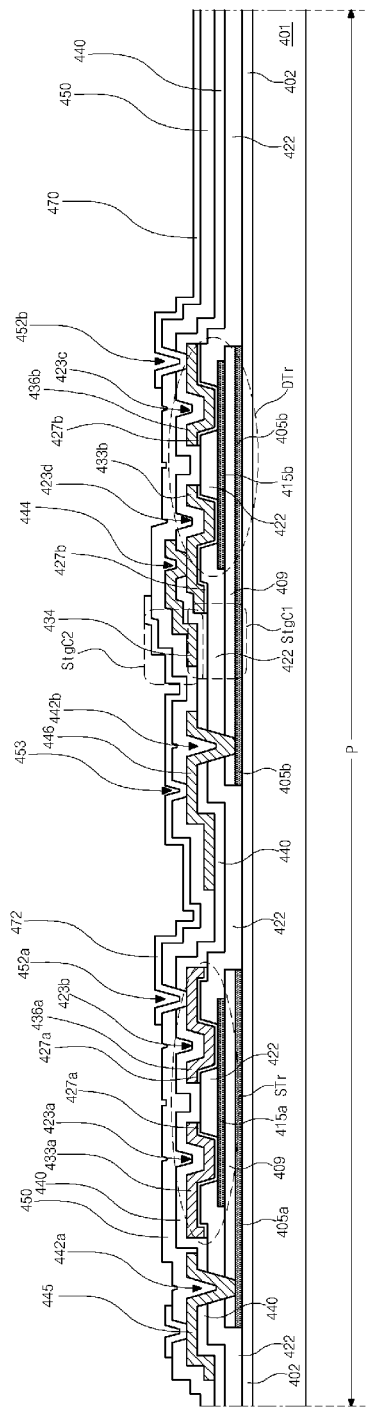
FIG. 8 is a cross-sectional view showing an array substrate for an organic electroluminescent display device according to a fourth embodiment of the present invention.

FIG. 8 is a cross-sectional view showing an array substrate for an organic electroluminescent display device according to a fourth embodiment of the present invention.

In FIG. 8, a buffer layer 402 of an inorganic insulating material is formed on an entire surface of a substrate 401, and first and second gate electrodes 405a and 405b each including an impurity-doped polycrystalline silicon are formed on the buffer layer 402. A gate insulating layer 409 of an inorganic insulating material is formed on the first and second gate electrodes 405a and 405b, and first and second active layers 415a and 415b each including an intrinsic polycrystalline silicon are formed on the gate insulating layer 409. The first and second active layers 415a and 415b are formed over the first and second gate electrodes 405a and 405b, respectively.

In addition, an interlayer insulating layer 422 including first to fourth active contact holes 423a, 423b, 423c and 423d is formed on the first and second active layers 415a and 415b. The first and second active contact holes 423a and 423b expose side portions of the first active layer 415a, respectively, and the third and fourth active contact holes 423c and 423d expose side portions of the second active layer 415b, respectively. First and second ohmic contact layers 427a and 427b of impurity-doped amorphous silicon are formed on the interlayer insulating layer 422. The first ohmic contact layer 427a is connected to the side portions of the first active layer 415a through the first and second active contact holes 423a and 423b, and the second ohmic contact layer 427b is connected to the side portions of the second active layer 415b through the third and fourth active contact holes 423c and 423d. A first source electrode 433a and a first drain electrode 436a spaced apart from each other are formed on the first ohmic contact layer 427a, and a second source electrode 433b and a second drain electrode 436b spaced apart from each other are formed on the second ohmic contact layer 427b. Although not shown in FIG. 8, a data line connected to the first source electrode 433a is formed on the interlayer insulating layer 422.

The first gate electrode 405a, the gate insulating layer 409, the first active layer 415a, the first ohmic contact layer 427a, the first source electrode 433a and the first drain electrode 436a constitute a switching thin film transistor (TFT) STr, and the second gate electrode 405b, the gate insulating layer 409, the second active layer 415b, the second ohmic contact layer 427b, the second source electrode 433b and the second drain electrode 436b constitute a driving TFT DTr.

Further, a first passivation layer 440 of an inorganic insulating material is formed on the first source electrode 433a, the first drain electrode 436a, the second source electrode 433b, the second drain electrode 436b and the data line. The first passivation layer 440, the interlayer insulating layer 422 and the gate insulating layer 409 include first and second gate contact holes 442a and 442b exposing the first and second gate electrodes 405a and 405b, respectively. In addition, the first passivation layer 440 includes source contact hole 444 exposing the second source electrode 433b.

A gate line 445, a gate auxiliary pattern 446 and a power electrode 434 are formed on the first passivation layer 440. The gate line 445 crosses the data line to define a pixel region P and is connected to the first gate electrode 405a through the first gate contact hole 442a. The gate auxiliary pattern 446 is connected to the second gate electrode 405b through the second gate contact hole 442b. In addition, the power electrode 434 is connected to the second source electrode 433b through the source contact hole 444 and is connected to a power line (not shown). The power electrode 434 and the second gate electrode 405b overlap each other with the gate insulating layer 409, the interlayer insulating layer 422 and the first passivation layer 440 interposed therebetween to constitute a first storage capacitor StgC1. Although not shown in FIG. 8, the power line parallel to the gate line 445 is formed on the first passivation layer 440 and is connected to the power electrode 434.

Moreover, a second passivation layer 450 of an inorganic insulating material is formed on the gate line 445, the gate auxiliary pattern 446 and the power electrode 434. The second passivation layer 450 includes an auxiliary contact hole 453 exposing the gate auxiliary pattern 446. In addition, the second passivation layer 450 and the first passivation layer 440 include first and second drain contact holes 452a and 452b exposing the first and second drain electrodes 436a and 436b, respectively.

A pixel electrode 470 and a gate connecting electrode 472 each including a transparent conductive material are formed on the second passivation layer 450. The pixel electrode 470 is connected to the second drain electrode 436b through the second drain contact hole 452b. The gate connecting electrode 472 is connected to the first drain electrode 436a through the first drain contact hole 452a and to the gate auxiliary pattern 446 through the auxiliary contact hole 453. In addition, the gate connecting electrode 472 overlaps the power electrode 434 with the second passivation layer 450 interposed therebetween to constitute a second storage capacitor StgC2.

Although not shown in FIG. 8, a bank of one of inorganic and organic insulating materials is formed at a boundary portion of the pixel region P. The bank may be formed on the second passivation layer 450 and the gate connecting electrode 472. In addition, an organic luminescent layer is formed on the pixel electrode 470 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 401. The pixel electrode 470, the organic luminescent layer and the reference electrode in the pixel region P constitute an organic electroluminescent (EL) diode.

In the organic ELD device according to the fourth embodiment of the present invention, since the first and second active layers 415a and 415b include intrinsic polycrystalline silicon, a mobility of the switching TFT STr and the driving TFT DTr is improved. In addition, since the first and second gate electrodes 405a and 405b include impurity-doped polycrystalline silicon, the crystallization step for the first and second active layers 415a and 415b is performed without deformation of the first and second gate electrodes 405a and 405b and a polycrystalline silicon TFT having a bottom gate structure is obtained. Further, the interlayer insulating layer 422 on a central portion of the first and second active layers 415a and 415b functions as an etch stopper for a channel region. Accordingly, the first and second active layers 415a and 415b have a uniform thickness and deterioration of the switching TFT STr and the driving TFT DTr due to the thickness difference is prevented. Moreover, since the first and second ohmic contact layers 427a and 427b are formed of impurity-doped amorphous silicon, a doping step using an ion implantation apparatus is omitted and initial investment for an additional apparatus is reduced.

Further, the power electrode 434 connected to the second source electrode 433b overlaps the second gate electrode 405b with the gate insulating layer 409 and the interlayer insulating layer 422 interposed therebetween to constitute the first storage capacitor StgC1, and the gate connecting electrode 472 connected to the second gate electrode 405b through the gate auxiliary pattern 446 overlaps the power electrode 434 extending from the second source electrode 433b with the second passivation layer 450 interposed therebetween to constitute the second storage capacitor StgC2. Since the first and second storage capacitors StgC1 and StgC2 are connected to the second source electrode 433b of the driving TFT DTr in parallel, the total storage capacitance of the organic ELD device increases.

Figure 9:
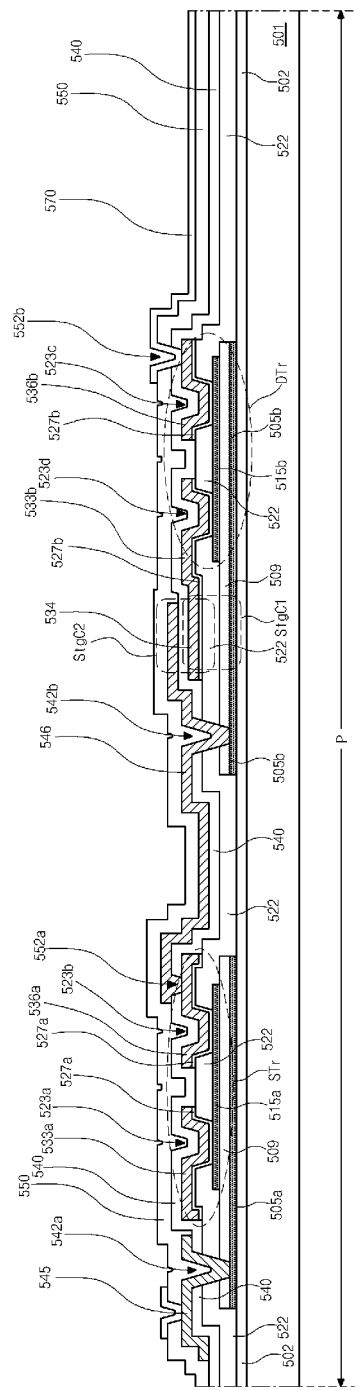
FIG. 9 is a cross-sectional view showing an array substrate for an organic electroluminescent display device according to a fifth embodiment of the present invention.

FIG. 9 is a cross-sectional view showing an array substrate for an organic electroluminescent display device according to a fifth embodiment of the present invention.

In FIG. 9, a buffer layer 502 of an inorganic insulating material is formed on an entire surface of a substrate 501, and first and second gate electrodes 505a and 505b each including an impurity-doped polycrystalline silicon are formed on the buffer layer 502. A gate insulating layer 509 of an inorganic insulating material is formed on the first and second gate electrodes 505a and 505b, and first and second active layers 515a and 515b each including an intrinsic polycrystalline silicon are formed on the gate insulating layer 509. The first and second active layers 515a and 515b are formed over the first and second gate electrodes 505a and 505b, respectively.

In addition, an interlayer insulating layer 522 including first to fourth active contact holes 523a, 523b, 523c and 523d is formed on the first and second active layers 515a and 515b. The first and second active contact holes 523a and 523b expose side portions of the first active layer 515a, respectively, and the third and fourth active contact holes 523c and 523d expose side portions of the second active layer 515b, respectively. First and second ohmic contact layers 527a and 527b of impurity-doped amorphous silicon are formed on the interlayer insulating layer 522. The first ohmic contact layer 527a is connected to the side portions of the first active layer 515a through the first and second active contact holes 523a and 523b, and the second ohmic contact layer 527b is connected to the side portions of the second active layer 515b through the third and fourth active contact holes 523c and 523d. A first source electrode 533a and a first drain electrode 536a spaced apart from each other are formed on the first ohmic contact layer 527a, and a second source electrode 533b and a second drain electrode 536b spaced apart from each other are formed on the second ohmic contact layer 527b. In addition, a power electrode 534 is formed on the second ohmic contact layer 527b. The second source electrode 533b extends to the power electrode 534 and the power electrode 534 is connected to a power line (not shown). Although not shown in FIG. 9, a data line connected to the first source electrode 533a is formed on the interlayer insulating layer 522.

The power electrode 534 and the second gate electrode 505b overlap each other with the gate insulating layer 509 and the interlayer insulating layer 522 interposed therebetween to constitute a first storage capacitor StgC1. In addition, the first gate electrode 505a, the gate insulating layer 509, the first active layer 515a, the first ohmic contact layer 527a, the first source electrode 533a and the first drain electrode 536a constitute a switching thin film transistor (TFT) STr, and the second gate electrode 505b, the gate insulating layer 509, the second active layer 515b, the second ohmic contact layer 527b, the second source electrode 533b and the second drain electrode 536b constitute a driving TFT DTr.

Further, a first passivation layer 540 of an inorganic insulating material is formed on the first source electrode 533a, the first drain electrode 536a, the second source electrode 533b, the second drain electrode 536b and the data line. The first passivation layer 540, the interlayer insulating layer 522 and the gate insulating layer 509 include first and second gate contact holes 542a and 542b exposing the first and second gate electrodes 505a and 505b, respectively. In addition, the first passivation layer 540 includes a first drain contact hole 552a exposing the first drain electrode 536a.

A gate line 545 and a gate auxiliary pattern 546 are formed on the first passivation layer 540. The gate line 545 crosses the data line to define a pixel region P and is connected to the first gate electrode 505a through the first gate contact hole 542a. The gate auxiliary pattern 546 is connected to the first drain electrode 536a through the first drain contact hole 552b and is connected to the second gate electrode 505b through the second gate contact hole 542b. In addition, the gate auxiliary pattern 546 connected to the second gate electrode 505b overlaps the power electrode 534 extending from the second source electrode 533b with the first passivation layer 540 interposed therebetween to constitute a second storage capacitor StgC2. Although not shown in FIG. 9, the power line parallel to the gate line 545 is formed on the first passivation layer 540 and is connected to the power electrode 534 through the power contact hole.

Moreover, a second passivation layer 550 of an inorganic insulating material is formed on the gate line 545 and the gate auxiliary pattern 546. The second passivation layer 550 and the first passivation layer 540 include a second drain contact hole 552b exposing the second drain electrode 536b. A pixel electrode 570 including a transparent conductive material is formed on the second passivation layer 550. The pixel electrode 570 is connected to the second drain electrode 536b through the second drain contact hole 552b.

Although not shown in FIG. 9, a bank of one of inorganic and organic insulating materials is formed at a boundary portion of the pixel region P. The bank may be formed on the second passivation layer 550 and the gate connecting electrode 572. In addition, an organic luminescent layer is formed on the pixel electrode 570 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 501. The pixel electrode 570, the organic luminescent layer and the reference electrode in the pixel region P constitute an organic electroluminescent (EL) diode.

In the organic ELD device according to the fifth embodiment of the present invention, since the first and second active layers 515a and 515b include intrinsic polycrystalline silicon, a mobility of the switching TFT STr and the driving TFT DTr is improved. In addition, since the first and second gate electrodes 505a and 505b include impurity-doped polycrystalline silicon, the crystallization step for the first and second active layers 515a and 515b is performed without deformation of the first and second gate electrodes 505a and 505b and a polycrystalline silicon TFT having a bottom gate structure is obtained. Further, the interlayer insulating layer 522 on a central portion of the first and second active layers 515a and 515b functions as an etch stopper for a channel region.

Accordingly, the first and second active layers 515a and 515b have a uniform thickness and deterioration of the switching TFT STr and the driving TFT DTr due to the thickness difference is prevented. Moreover, since the first and second ohmic contact layers 527a and 527b are formed of impurity-doped amorphous silicon, a doping step using an ion implantation apparatus is omitted and initial investment for an additional apparatus is reduced.

Further, the power electrode 534 extending from the second source electrode 533b overlaps the second gate electrode 505b with the gate insulating layer 509 and the interlayer insulating layer 522 interposed therebetween to constitute the first storage capacitor StgC1, and the gate auxiliary pattern 546 connected to the second gate electrode 505b overlaps the power electrode 534 extending from the second source electrode 533b with the first passivation layer 540 interposed therebetween to constitute the second storage capacitor StgC2. Since the first and second storage capacitors StgC1 and StgC2 are connected to the second source electrode 533b of the driving TFT DTr in parallel, the total storage capacitance of the organic ELD device increases.

Figure 10:
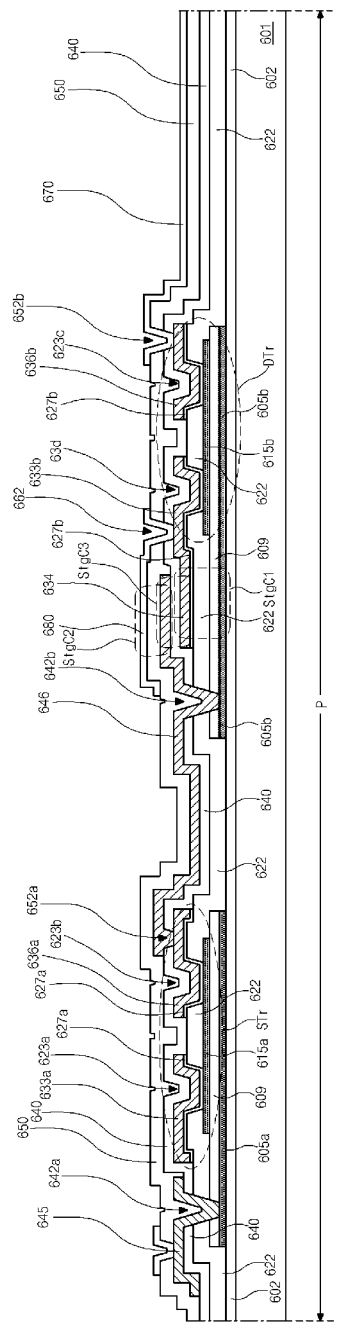
FIG. 10 is a cross-sectional view showing an array substrate for an organic electroluminescent display device according to a sixth embodiment of the present invention.

FIG. 10 is a cross-sectional view showing an array substrate for an organic electroluminescent display device according to a sixth embodiment of the present invention.

In FIG. 10, a buffer layer 602 of an inorganic insulating material is formed on an entire surface of a substrate 601, and first and second gate electrodes 605a and 605b each including an impurity-doped polycrystalline silicon are formed on the buffer layer 602. A gate insulating layer 609 of an inorganic insulating material is formed on the first and second gate electrodes 605a and 605b, and first and second active layers 615a and 615b each including an intrinsic polycrystalline silicon are formed on the gate insulating layer 609. The first and second active layers 615a and 615b are formed over the first and second gate electrodes 605a and 605b, respectively.

In addition, an interlayer insulating layer 622 including first to fourth active contact holes 623a, 623b, 623c and 623d is formed on the first and second active layers 615a and 615b. The first and second active contact holes 623a and 623b expos side portions of the first active layer 615a, respectively, and the third and fourth active contact holes 623c and 623d expose side portions of the second active layer 615b, respectively. First and second ohmic contact layers 627a and 627b of impurity-doped amorphous silicon are formed on the interlayer insulating layer 622. The first ohmic contact layer 627a is connected to the side portions of the first active layer 615a through the first and second active contact holes 623a and 623b, and the second ohmic contact layer 627b is connected to the side portions of the second active layer 615b through the third and fourth active contact holes 623c and 623d. A first source electrode 633a and a first drain electrode 636a spaced apart from each other are formed on the first ohmic contact layer 627a, and a second source electrode 633b and a second drain electrode 636b spaced apart from each other are formed on the second ohmic contact layer 627b. In addition, a power electrode 634 is formed on the second ohmic contact layer 627b. The second source electrode 633b extends to the power electrode 634 and the power electrode 634 is connected to a power line (not shown). Although not shown in FIG. 10, a data line connected to the first source electrode 633a is formed on the interlayer insulating layer 622.

The power electrode 634 and the second gate electrode 605b overlap each other with the gate insulating layer 609 and the interlayer insulating layer 622 interposed therebetween to constitute a first storage capacitor StgC1. In addition, the first gate electrode 605a, the gate insulating layer 609, the first active layer 615a, the first ohmic contact layer 627a, the first source electrode 633a and the first drain electrode 636a constitute a switching thin film transistor (TFT) STr, and the second gate electrode 605b, the gate insulating layer 609, the second active layer 615b, the second ohmic contact layer 627b, the second source electrode 633b and the second drain electrode 636b constitute a driving TFT DTr.

Further, a first passivation layer 640 of an inorganic insulating material is formed on the first source electrode 633a, the first drain electrode 636a, the second source electrode 633b, the second drain electrode 636b and the data line. The first passivation layer 640, the interlayer insulating layer 622 and the gate insulating layer 609 include first and second gate contact holes 642a and 642b exposing the first and second gate electrodes 605a and 605b, respectively. In addition, the first passivation layer 640 includes a first drain contact hole 652a exposing the first drain electrode 636a.

A gate line 645 and a gate auxiliary pattern 646 are formed on the first passivation layer 640. The gate line 645 crosses the data line to define a pixel region P and is connected to the first gate electrode 605a through the first gate contact hole 642a. The gate auxiliary pattern 646 is connected to the first drain electrode 636a through the first drain contact hole 652b and is connected to the second gate electrode 605b through the second gate contact hole 642b. In addition, the gate auxiliary pattern 646 connected to the second gate electrode 605b overlaps the power electrode 634 extending from the second source electrode 633b with the first passivation layer 640 interposed therebetween to constitute a second storage capacitor StgC2. Although not shown in FIG. 10, the power line parallel to the gate line 645 is formed on the first passivation layer 640 and is connected to the power electrode 634 through the power contact hole.

Moreover, a second passivation layer 650 of an inorganic insulating material is formed on the gate line 645 and the gate auxiliary pattern 646. The second passivation layer 650 and the first passivation layer 640 include a second drain contact hole 652b exposing the second drain electrode 636b and a source contact hole 662 exposing the second source electrode 633b. A pixel electrode 670 and a capacitor auxiliary pattern 680 each including a transparent conductive material are formed on the second passivation layer 650. The pixel electrode 670 is connected to the second drain electrode 636b through the second drain contact hole 652b, and the capacitor auxiliary pattern 680 is connected to the second source electrode 633b through the source contact hole 662. In addition, the capacitor auxiliary pattern 680 connected to the second source electrode 633b overlaps the gate auxiliary pattern 646 connected to the second gate electrode 605b with the second passivation layer 650 interposed therebetween to constitute a third storage capacitor StgC3.

Although not shown in FIG. 10, a bank of one of inorganic and organic insulating materials is formed at a boundary portion of the pixel region P. The bank may be formed on the second passivation layer 650 and the gate connecting electrode 672. In addition, an organic luminescent layer is formed on the pixel electrode 670 and a reference electrode is formed on the organic luminescent layer. The organic luminescent layer emits one of red, green and blue colored lights and the organic luminescent layers emitting different colored lights may be alternately disposed in the pixel regions P. The reference electrode may be formed over an entire surface of the substrate 601. The pixel electrode 670, the organic luminescent layer and the reference electrode in the pixel region P constitute an organic electroluminescent (EL) diode.

In the organic ELD device according to the sixth embodiment of the present invention, since the first and second active layers 615a and 615b include intrinsic polycrystalline silicon, a mobility of the switching TFT STr and the driving TFT DTr is improved. In addition, since the first and second gate electrodes 605a and 605b include impurity-doped polycrystalline silicon, the crystallization step for the first and second active layers 615a and 615b is performed without deformation of the first and second gate electrodes 605a and 605b and a polycrystalline silicon TFT having a bottom gate structure is obtained. Further, the interlayer insulating layer 622 on a central portion of the first and second active layers 615a and 615b functions as an etch stopper for a channel region. Accordingly, the first and second active layers 615a and 615b have a uniform thickness and deterioration of the switching TFT STr and the driving TFT DTr due to the thickness difference is prevented. Moreover, since the first and second ohmic contact layers 627a and 627b are formed of impurity-doped amorphous silicon, a doping step using an ion implantation apparatus is omitted and initial investment for an additional apparatus is reduced.

Further, the power electrode 634 extending from the second source electrode 633b overlaps the second gate electrode 605b with the gate insulating layer 609 and the interlayer insulating layer 622 interposed therebetween to constitute the first storage capacitor StgC1, the gate auxiliary pattern 646 connected to the second gate electrode 605b overlaps the power electrode 634 extending from the second source electrode 633b with the first passivation layer 640 interposed therebetween to constitute the second storage capacitor StgC2, and the capacitor auxiliary pattern 680 connected to the second source electrode 633b overlaps the gate auxiliary pattern 646 connected to the second gate electrode 605b with the second passivation layer 650 interposed therebetween to constitute the third storage capacitor StgC3. Since the first, second and third storage capacitors StgC1, StgC2 and StgC3 are connected to the second source electrode 633b of the driving TFT DTr in parallel, the total storage capacitance of the organic ELD device increases.

Although an array substrate for an organic electroluminescent display device is illustrated in first to sixth embodiments of the present invention, the structure and the fabricating method of the TFT of the first to sixth embodiments can be applied to an array substrate for another display device such as a liquid crystal display device. For example, the pixel electrode may be connected to the switching TFT without the driving TFT in the array substrate for an LCD device.

It will be apparent to those skilled in the art that various modifications and variations can be made in the method of fabricating a display device using a plastic substrate of the present invention without departing from the spirit or scope of the invention. Thus, it is intended that the present invention cover the modifications and variations of this invention provided they come within the scope of the appended claims and their equivalents.

What is claimed is:
1. An array substrate for a display device, comprising:
a substrate;
first and second gate electrodes of impurity-doped polycrystalline silicon on the substrate;
a gate insulating layer on the first and second gate electrodes; first and second active layers of intrinsic polycrystalline silicon on the gate insulating layer, the first and second active layers corresponding to the first and second gate electrodes, respectively;
an interlayer insulating layer on the first and second active layers and including first to fourth active contact holes, the first and second active contact holes exposing side portions of the first active layer, the third and fourth active contact holes exposing side portions of the second active layer;

first and second ohmic contact layers of impurity-doped amorphous silicon on the interlayer insulating layer, the first ohmic contact layer contacting the first active layer through the first and second active contact holes, the second ohmic contact layer contacting the second active layer through the third and fourth active contact holes;

first source and drain electrodes on the first ohmic contact layer and second source and drain electrodes on the second ohmic contact layer;

a data line on the interlayer insulating layer, the data line connected to the first source electrode;

a first passivation layer on the first source and drain electrodes, the second source and drain electrodes and the data line;

a gate line and a gate auxiliary pattern on the first passivation layer, the gate line connected to the first gate electrode and crossing the data line to define a pixel region, the gate auxiliary pattern electrically connected to the first drain electrode and the second gate electrode;

a second passivation layer on the gate line;

a power electrode connected to the second source electrode;

a pixel electrode on the second passivation layer, the pixel electrode connected to the second drain electrode; and a capacitor auxiliary pattern on the second passivation layer and connected to the second source electrode through a source contact hole in the first and second passivation layers, wherein the first passivation layer includes a first drain contact hole exposing the first drain electrode, and the first and second passivation layers include a second drain contact hole exposing the second drain electrode, wherein the gate auxiliary pattern is connected to the first drain electrode through the first drain contact hole, and the pixel electrode is connected to the second drain electrode through the second drain contact hole, wherein the power electrode is formed on the interlayer insulating layer and extends from the second source electrode, and the power electrode overlaps the second gate electrode to constitute a first storage capacitor with the gate insulating layer and the interlayer insulating layer interposed therebetween, wherein the gate auxiliary pattern overlaps the power electrode to constitute a second storage capacitor with the first passivation layer interposed therebetween, and wherein the capacitor auxiliary pattern overlaps the gate auxiliary pattern to constitute a third storage capacitor with the second passivation layer interposed therebetween.

2. An array substrate for a display device, comprising:

a substrate;

first and second gate electrodes of impurity-doped polycrystalline silicon on the substrate;

a gate insulating layer on the first and second gate electrodes;

first and second active layers of intrinsic polycrystalline silicon on the gate insulating layer, the first and second active layers corresponding to the first and second gate electrodes, respectively;

an interlayer insulating layer on the first and second active layers and including first to fourth active contact holes, the first and second active contact holes exposing side portions of the first active layer, the third and fourth active contact holes exposing side portions of the second active layer;

first and second ohmic contact layers of impurity-doped amorphous silicon on the interlayer insulating layer, the first ohmic contact layer contacting the first active layer through the first and second active contact holes, the second ohmic contact layer contacting the second active layer through the third and fourth active contact holes;

first source and drain electrodes on the first ohmic contact layer and second source and drain electrodes on the second ohmic contact layer;

a data line on the interlayer insulating layer, the data line connected to the first source electrode;

a first passivation layer on the first source and drain electrodes, the second source and drain electrodes and the data line;

a gate line and a gate auxiliary pattern on the first passivation layer, the gate line connected to the first gate electrode and crossing the data line to define a pixel region, the gate auxiliary pattern electrically connected to the first drain electrode and the second gate electrode;

a second passivation layer on the gate line;

a power electrode connected to the second source electrode;

a pixel electrode on the second passivation layer, the pixel electrode connected to the second drain electrode; and a capacitor auxiliary pattern on the second passivation layer and connected to the second source electrode through a source contact hole in the first and second passivation wherein the first passivation layer includes a first drain contact hole exposing the first drain electrode, and the first and second passivation layers include a second drain contact hole exposing the second drain electrode, wherein the gate auxiliary pattern is connected to the first drain electrode through the first drain contact hole, and the pixel electrode is connected to the second drain electrode through the second drain contact hole, wherein the gate insulating layer, the interlayer insulating layer and the first passivation layer include first and second gate contact holes exposing the first and second gate electrodes, respectively, wherein the gate line is connected to the first gate electrode through the first gate contact hole and the gate auxiliary pattern is connected to the second gate electrode through the second gate contact hole, wherein the power electrode is formed on the interlayer insulating layer and extends from the second source electrode, and the power electrode overlaps the second gate electrode to constitute a first storage capacitor with the gate insulating layer and the interlayer insulating layer interposed therebetween, and wherein the gate auxiliary pattern overlaps the power electrode to constitute a second storage capacitor with the first passivation layer interposed therebetween, and wherein the capacitor auxiliary pattern overlaps the gate auxiliary pattern to constitute a third storage capacitor with the second passivation layer interposed therebetween.

* * * * *